(12) United States Patent
Welch

(10) Patent No.: US 7,082,772 B2
(45) Date of Patent: Aug. 1, 2006

(54) PELTIER TEMPERATURE CONTROL SYSTEM FOR ELECTRONIC COMPONENTS

(75) Inventor: John T. Welch, Phoenix, AZ (US)

(73) Assignee: Directed Electronics, Inc., Vista, CA (US)

( * ) Notice: Subject to any disclaimer, the term of this patent is extended or adjusted under 35 U.S.C. 154(b) by 348 days.

(21) Appl. No.: 10/645,882

(22) Filed: Aug. 20, 2003

(65) Prior Publication Data

US 2005/0039465 A1    Feb. 24, 2005

(51) Int. Cl.
    *F25B 21/02*    (2006.01)
(52) U.S. Cl. .............................. 62/3.2; 62/3.3; 62/3.4; 62/3.7
(58) Field of Classification Search .............. 62/3.2, 62/3.3, 3.4, 3.7
    See application file for complete search history.

(56) References Cited

U.S. PATENT DOCUMENTS

| | | | | |
|---|---|---|---|---|
| 5,385,022 A | * | 1/1995 | Kornblit | 62/3.7 |
| 5,457,342 A | * | 10/1995 | Herbst, II | 361/696 |
| 5,515,682 A | * | 5/1996 | Nagakubo et al. | 62/3.7 |
| 5,946,188 A | * | 8/1999 | Rochel et al. | 361/690 |
| 6,055,814 A | * | 5/2000 | Song | 62/3.2 |
| 6,173,576 B1 | * | 1/2001 | Ishida et al. | 62/3.7 |
| 6,196,003 B1 | * | 3/2001 | Macias et al. | 62/3.7 |
| 6,234,240 B1 | * | 5/2001 | Cheon | 62/3.2 |
| 6,581,388 B1 | * | 6/2003 | Novotny et al. | 62/3.7 |

* cited by examiner

*Primary Examiner*—Cheryl Tyler
*Assistant Examiner*—B. Clayton McCraw
(74) *Attorney, Agent, or Firm*—K C Bean, Esq.; Anatoly S. Weiser, Esq.

(57) ABSTRACT

A cooling system for audio equipment uses a temperature sensor and Peltier effect module in a feedback control loop. The cooling system reads the temperature sensor to obtain the temperature of an audio component of the equipment, and adjusts the drive for the Peltier effect module that cools the audio component, to prevent overheating of the component. The cooling system may include an autonomous power supply that generates electric power from the audio signal driving a loudspeaker of the audio system. In another embodiment, the cooling system cools an audio component installed in a vehicle, even when the vehicle is unattended. To prevent discharge of the vehicle's battery, the cooling system employs a battery supervisor for turning the cooling system off when the battery has discharged down to a predetermined state.

49 Claims, 6 Drawing Sheets

PELTIER TEMPERATURE CONTROL SYSTEM FOR ELECTRONIC COMPONENTS

BACKGROUND OF THE INVENTION

1. Field of the Invention

The present invention relates generally to apparatus and methods for cooling electronic components, and, more particularly, to apparatus and methods for cooling audio components.

2. Background

Electronic devices use electric energy. Because their efficiency is less than 100%, a portion of the electric energy is converted into thermal energy. In fact, the efficiency of many electronic components is less than 50%, and often much less than 50%. Such devices convert most of the electric energy provided to them into thermal energy.

The thermal energy—heat—must be dissipated outside of the device where it is converted from the electric energy, or the heat will build up, raising the temperature of the device. Heat buildup is undesirable because high temperatures can degrade performance of electronic devices and, when maximum temperature ratings are exceeded, damage or destroy them. The common trend toward denser packaging aggravates the heat buildup problem, because more power is converted into heat in progressively smaller spaces, and because of the increased difficulty of providing good ventilation in small spaces. Automotive and other vehicular audio installations present specially challenging thermal management problems to designers. There are several reasons for these special challenges.

First, space for installing audio equipment is rather limited in a typical vehicle.

Second, efficiencies of audio loudspeakers are generally quite low. Therefore, the loudspeakers convert into heat most of the power delivered to them. Furthermore, the loudspeakers need to be driven by powerful amplifiers. And the more powerful an amplifier is, the more power it dissipates.

Third, temperatures inside a closed vehicle left in the sun can quickly rise into triple digits. When the driver of the vehicle returns to the vehicle and turns on the audio equipment, the temperature of the equipment may already be close to its maximum rated temperature. Additional temperature elevation resulting from the dissipation of electric energy can damage the equipment, or trigger thermal shutdown of the equipment to avoid the damage.

Previous solutions to the thermal management problems in automotive environments usually involved installation of electric fans to improve ventilation and cool the audio equipment. Unfortunately, fans may not perform adequately because of space limitations in a car: it is difficult to find a good location for a fan, i.e., a location from which the fan can drive fresh air at the power-dissipating components. Fans also tend to be noisy. Moreover, when the car is parked in the sun, the fan merely blows hot air at the audio components, and does not provide the desired cooling effect. Furthermore, fans consume electric power and can discharge the car's battery. For this reason, a typical external (add-on) fan is connected through a switch that does not allow the fan to run when the car's engine is not running.

A need thus exists for cooling systems for electronic devices, and particularly for audio components installed in vehicles, that overcome the shortcomings of existing technologies.

SUMMARY

The present invention is directed to apparatus and methods that satisfy these needs. The invention herein disclosed is a temperature control system for an electronic component, such as an audio component installed in an automobile or another vehicle. The system includes a Peltier module with two sides (two thermocouples): one side absorbs heat when electric current flows through the Peltier module in one direction; this side is referred to as the "cooling side." A second side, referred to as the "warming side," releases heat when the current flows in the same direction. When the current reverses, the two sides reverse their functions, i.e., the cooling side now releases heat, while the warming side absorbs heat.

A Peltier driver provides the current for the Peltier module. A control signal at a control input of the Peltier driver regulates the flow of the current. In particular, the control signal determines whether the current flows, and the magnitude of the current when it does flow. In some embodiments, the control signal can also reverse the direction of the current. The Peltier driver can be a voltage source, a current source, a pulse-width modulated power supply, or a connection to the power supply of the automobile or of another installed environment.

A temperature sensor generates indications of temperature of the electronic component. The sensor can be, for example, a thermistor attached to the electronic component or a digital device that sends temperature readings over a digital bus connection. A temperature reader coupled to the temperature sensor receives the indications of temperature from the temperature sensor and interprets them, generating temperature signals from the temperature indications. The temperature signals are transmitted to a feedback control circuit coupled to the temperature reader. The feedback control circuit includes a control output, which is coupled to the control input of the Peltier driver and provides the control signals that regulate the current to the Peltier module.

In some embodiments, the temperature reader is a comparator circuit that compares (1) a voltage generated from voltage division between the thermistor and a fixed resistor, and (2) a reference voltage. The output of the comparator switches the Peltier module, for example, through a relay, a Bipolar transistor, or a MOSFET. In one of the alternative embodiments, the output of the temperature reader is integrated over time to produce an analog or multi-state digital control signal for modulating the Peltier driver.

Some embodiments of the invention include fans for improving ventilation. A fan can blow air directly at the electronic component, or the air can first pass over the cooling side of the Peltier module. Alternatively, the fan can blow air at the warming side of the Peltier module, to improve efficiency of the module.

The cooling system can be based on a digital controller, such as a microprocessor or a microcontroller. In this case, the microcontroller, executing its program code, reads the temperature from the temperature sensor and outputs an appropriate control signal to the Peltier driver. In various versions of the controller-based embodiments, the digital controller can include an analog-to-digital converter for reading the output of the temperature sensor, and a digital-to-analog converter for adjusting the control signal.

The cooling system can also include a battery supervisor for monitoring the battery of the installed environment. When the cooling system with a battery supervisor is powered by a battery (e.g., when the engine of an automobile where the cooling system is installed is not running), the supervisor detects when the battery discharges to a predetermined discharge state, and turns off the cooling system to prevent further discharge of the battery.

In some audio installations the cooling system includes an autonomous power supply that generates the power for the cooling system from an audio signal, making a separate power supply connection not necessary.

BRIEF DESCRIPTION OF THE DRAWINGS

These and other features and aspects of the present invention will be better understood with reference to the following description, appended claims, and accompanying drawings, where:

DETAILED DESCRIPTION

Figure 1:
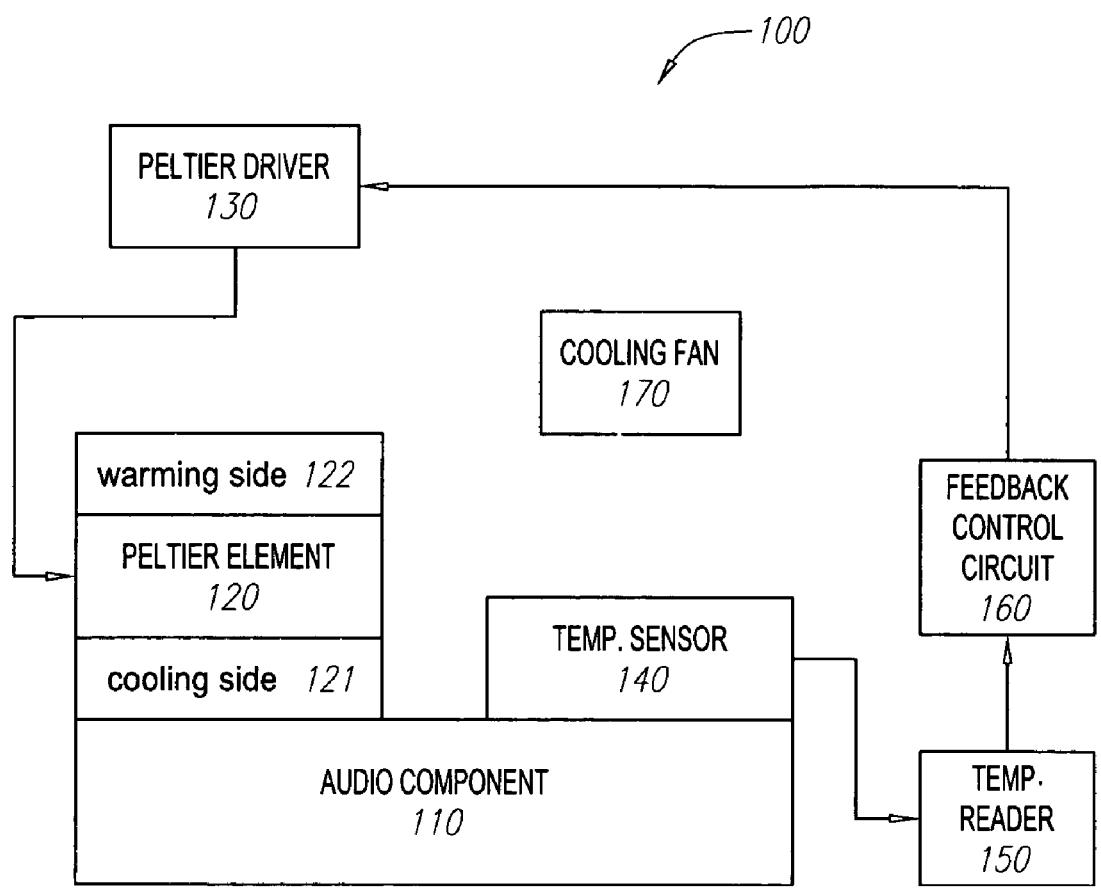
FIG. 1 is a simplified block diagram of a cooling system for an automotive audio component 110, in accordance with the present invention.

Reference will now be made in detail to several embodiments of the invention that are illustrated in the accompanying drawings. Wherever possible, same or similar reference numerals are used in the drawings and the description to refer to the same or like parts. The drawings are in simplified form and are not to precise scale. For purposes of convenience and clarity only, directional terms, such as top, bottom, left, right, up, down, over, above, below, beneath, rear, and front, may be used with respect to the accompanying drawings. These and similar directional terms should not be construed to limit the scope of the invention in any manner. Note also that the words such as "connect," "couple," and similar terms with their inflections do not necessarily denote direct and immediate connections, but also include connections through intermediate elements or devices.

Referring more particularly to the drawings, FIG. 1 is a simplified block diagram of a cooling system 100 for an automotive audio component 110, in accordance with the present invention. A Peltier cooling module 120 and a temperature sensor 140 are in direct contact with the audio component 110. A temperature reader 150 receives the output of the temperature sensor 140, interprets the received output, and generates an estimate of the temperature at the surface of the audio component 110. The temperature reader 150 sends the temperature estimate to a feedback control circuit 160, which uses the estimate, possibly in conjunction with other factors, to determine the required drive current for the Peltier cooling module 120. The feedback control circuit 160 then causes a Peltier driver 130 to provide the drive current to the Peltier cooling module 120.

The Peltier cooling module 120 is essentially a thermoelectric heat pump using the Peltier effect to transfer heat from its cooling side 121 to its warming side 122. The Peltier effect, discovered in 1834, manifests itself when electric current passes through a circuit of dissimilar conductors belonging to the thermoelectric series, or through dissimilar semiconductor (solid state) materials. One junction of the two dissimilar materials in the circuit, also referred to as a "thermocouple" or "thermocouple junction," absorbs heat, while a second junction releases it. Each junction absorbs or releases the heat in proportion to the electric current driven through the circuit. The current's direction determines which thermocouple junction (or junctions) in the circuit will absorb and which junction (or junctions) will release heat.

The members of the thermoelectric series include the following elements: Aluminum, Antimony, Arsenic, Bismuth, Cobalt, Copper, Chromium, Germanium, Gold, Iridium, Iron, Lead, Manganese, Mercury, Molybdenum, Nickel, Palladium, Platinum, Rhodium, Silicon, Silver, Tellurium, Tin, Titanium, Tungsten, Uranium, and Zinc. In one version of the cooling system 100, the Peltier module 120 includes Antimony-Bismuth thermocouples; the Peltier module 120 of another version of the cooling system 100 uses Bismuth Telluride doped with Selenium and Antimony as the semiconductor material of choice for the thermocouples.

Temperature drops of 20° C. to 50° C. and even greater can be obtained from a single junction pair of a Peltier module, depending on many factors, and particularly on the temperature of the junction that releases the heat. For higher temperature drops, multiple junction pairs can be cascaded in series. In the present application, the heat-absorbing junction is likely to be at a higher temperature than the heat releasing junction, because the audio component dissipates heat and its temperature is likely to rise above the ambient temperature. The operation of the thermocouple is thus made even more efficient. Peltier modules' main advantages over conventional, compressor-based refrigeration systems are their size, weight, and absence of moving parts that can wear out.

Ready for use Peltier modules are available from several sources, including Supercool AB, Box 27, 401 20 Guteborg, Sweden, tel. 46 31-42 05 30, www.supercool.se; and Maxim, 120 San Gabriel Drive, Sunnyvale, Calif. 94086, tel. (408) 737-7600.

Note that when the current through a Peltier module is reversed, the module's cooling side becomes its warming side. This characteristic allows the system 100 to be used for warming the audio component 110 when the ambient temperature falls below operational limit of the component, or otherwise becomes lower than is desirable, or when condensation can form and interfere with performance of the audio component. Thus, one version of the cooling system 100 reverses the direction of the current driving the Peltier module 120 when the temperature of the audio component 110 falls to a predetermined low temperature limit, or when a relative humidity sensor indicates that condensation is likely.

In one embodiment of the cooling system 100, the cooling side 121 of the Peltier cooling module 120 is in direct contact with an upper portion of the audio component 110 (i.e., the portion positioned higher than the rest of the component 110), so that the heat generated in the audio component 110 rises towards the cooling side 121. This physical arrangement provides cooling to the portion of the audio component 110 that is likely to be at a higher temperature than the average temperature within the component 110.

In another embodiment of the cooling system 100, the cooling side 121 is in direct contact with a heat sink that is attached to the audio component 110. This arrangement allows the heat generated in the audio component 110 to be dissipated thorough the heat sink even after a malfunction of the Peltier module 120 or of another component of the cooling system 100, providing a partial fail safe mode of operation.

In yet another embodiment of the cooling system 100, the cooling side 121 is disposed in the path of the air blown towards the audio component 110 (or towards a heat sink attached to the audio component 110) by a cooling fan 170. Thus, the air that reaches the audio component 110 is cooler than the ambient temperature and provides better cooling than in the absence of the Peltier module 120. Because the operation of the cooling fan 170 can be largely independent from the operation of the rest of the cooling system 100, this embodiment also provides a partial fail safe mode of operation.

In still another embodiment of the cooling system 100, the fan 170 blows on the warming side 122 of the Peltier module 120. This arrangement of the cooling fan 170 and the Peltier module 120 lowers the temperature of the warming side 122 by carrying excess heat away from the side 122, thereby helping the Peltier module 120 to cool the audio component 110 more efficiently.

Overheating of audio components, particularly of audio amplifiers, is usually a localized rather than a global problem: some elements of an amplifier dissipate more power or are more sensitive to temperature rise than other components. Two specific problem areas of amplifiers are (1) the active devices of the output stages (typically MOSFETs), and (2) the step-up transformer that generates the high voltage rail power supply for the output stage or stages of the amplifier. (The transformer will be discussed in more detail below, in relation to the embodiment of FIG. 9.)

Figure 1A:
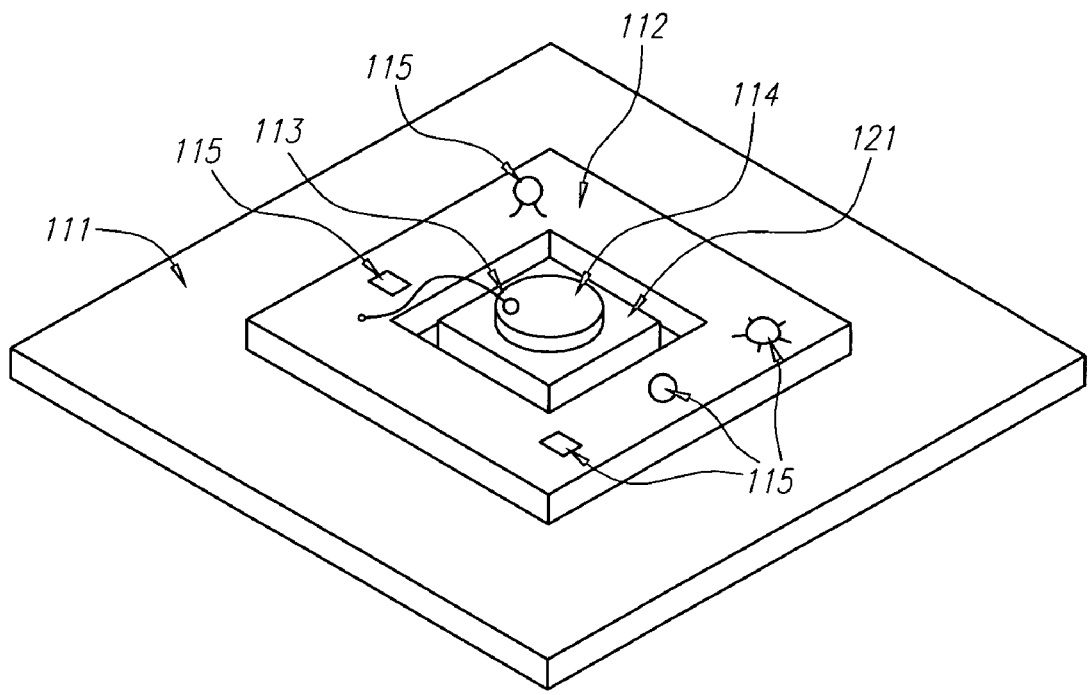
FIG. 1A is a simplified schematic diagram of the physical relationship of an audio component and a Peltier module of a cooling system in accordance with the present invention.

To alleviate efficiently the overheating of these heat-dissipating devices, in a fifth embodiment of the cooling system 100 these temperature sensitive devices are mounted directly onto the cooling side 121 of the Peltier cooling module 120. The details of this physical arrangement are schematically illustrated in FIG. 1A.

The amplifier 110 includes a heat sink 111 and a circuit board 112 attached to the heat sink 111. The circuit board 112 is populated with various electrical circuit parts 115 and has a cutout 113 extending down to the heat sink 111. The Peltier module 120 is disposed within the cutout 113 so that the warming side 122 is attached to the heat sink 111, while the cooling side 121 is positioned to receive the heat-dissipating device (or devices) 114, e.g., the transformer and/or the output stage MOSFETs. Heat dissipated by the device 114 thus flows into the heat sink 111 through the Peltier module 120, which present very low or even negative thermal resistance.

Turning now back to components of the system 100, the temperature sensor 140 is a thermistor attached to and in direct contact with the component 110. A thermistor is a small piece of semiconducting material the resistance of which varies with temperature, enabling it to be used for temperature measurement. The thermistor for the temperature sensor 140 can be obtained together with a characteristic curve of its resistance as a function of temperature. Alternatively, the thermistor can be characterized before it is used in the cooling system 100. In one embodiment, the characterization of the thermistor allows temperature measurement with precision of about $+/-2°$ C. The temperature sensor 140 can also be an integrated digital device readable through a digital connection.

Figure 2:
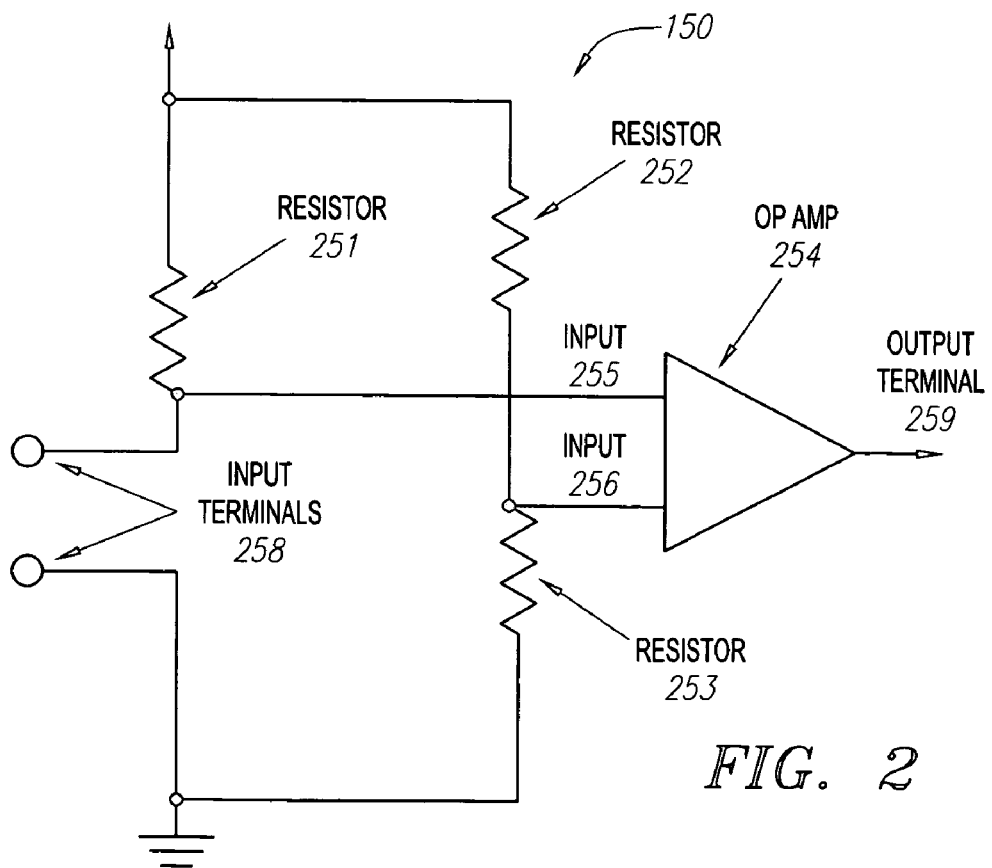
FIG. 2 is a simplified diagram illustrating internal construction of a temperature reader of a cooling system in accordance with the present invention.

The temperature reader 150 reads and interprets the indications of temperature provided by the temperature sensor 140, and generates a temperature signal to the feedback control circuit 160. FIG. 2 illustrates internal construction of one embodiment of the temperature reader 150. As shown, the reader 150 includes a voltage comparison device 254, for example, a comparator or an operational amplifier (OP AMP), which compares the voltages appearing at its inputs 255 and 256. Two voltage dividers generate these voltages. The first voltage divider is formed by resistors 252 and 253; this divider produces the voltage at the input 256. The second voltage divider is formed by a resistor 251 and the thermistor of the temperature sensor 140, which connects between input terminals 258; this divider produces the voltage at the input 255, which voltage is a function of the temperature of the sensor 140.

Output 259 of the OP AMP 254 is driven either to the high voltage rail (ON state) or low voltage rail (OFF state), depending on the +/− assignments of the inputs 255 and 256, and the voltages on these inputs. The values of the resistors 251, 252, and 253 relative to the thermistor of the temperature sensor 140 are chosen so that the transition between the ON and OFF states of the OP AMP 254 takes place at or below the maximum rated temperature of the audio component 110. This configuration of the temperature reader 150 is essentially an impedance bridge (also known as Wheatstone bridge) driving a comparator or operational amplifier.

Note that a small amount of hysteresis can be built into the temperature reader 150, for example, by providing a large feedback resistor from the output 259 to the "+" input of the OP AMP 254 (either the input 255 or the input 256).

The feedback control circuit 160 can be a switch, such as a mechanical or semiconductor relay, turning the Peltier driver 130 on and off, depending on the state of the signal on the output terminal 259 of the temperature reader 150. In this case, the Peltier driver 130 can be, for example, (1) a simple connection between the Peltier module 120 and the power source of the installed environment (e.g., the battery of an automobile) through the contact terminals of the relay; (2) another voltage source; or (2) a current source. (In this document, current sources and voltage sources will be generically designated as "drive sources.")

Figure 3:
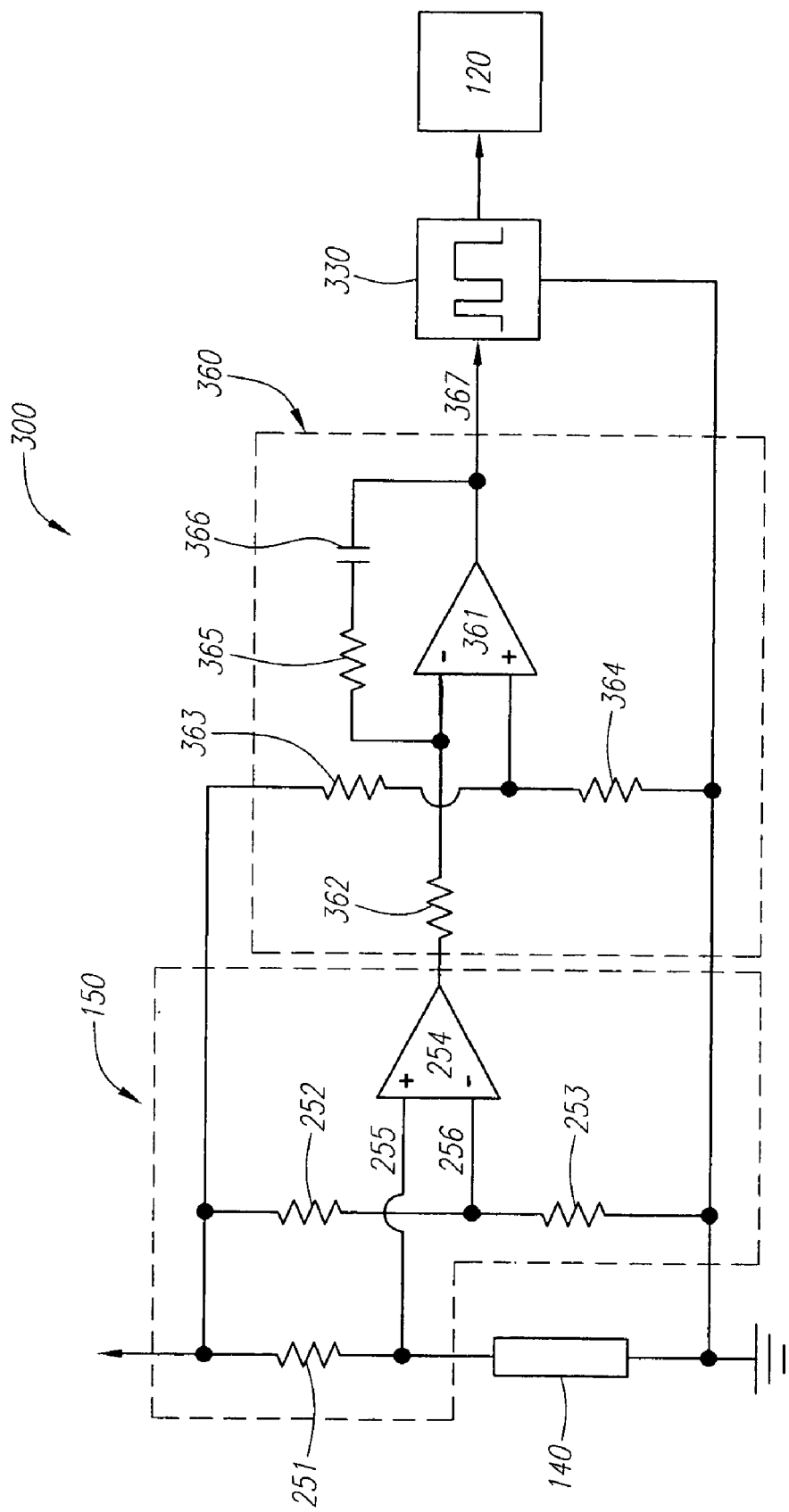
FIG. 3 is a simplified diagram of a cooling system with an integrator in a feedback control circuit of the cooling system, in accordance with the present invention.

The feedback control circuit can also take on a more complicated form to give a higher-order response to the feedback loop of the system 100. FIG. 3 illustrates an exemplary embodiment of a cooling system 300 with an integrator in a feedback control circuit 360. The integrator includes operating point setting resistors 363 and 364, integrator resistors 362 and 365, a capacitor 366, and an integrator OP AMP 361. In operation, the ON/OFF output of the temperature reader 150 is integrated by the feedback control circuit 360 to provide a control input 367 to a pulse-width modulated (PWM) power supply 330. The power supply 330 generates power pulses of variable length, depending on the voltage of the control signal 367 output by the feedback control circuit 360. Because the cooling side 121 of the Peltier module 120 absorbs heat only when electric current flows through the Peltier module 120, the variable duty cycle of the power supply 330 in effect determines the cooling provided to the audio component 110 (which is not shown in FIG. 3). The power supply 330 thus functions as the Peltier driver for the Peltier module 120.

Figure 4:
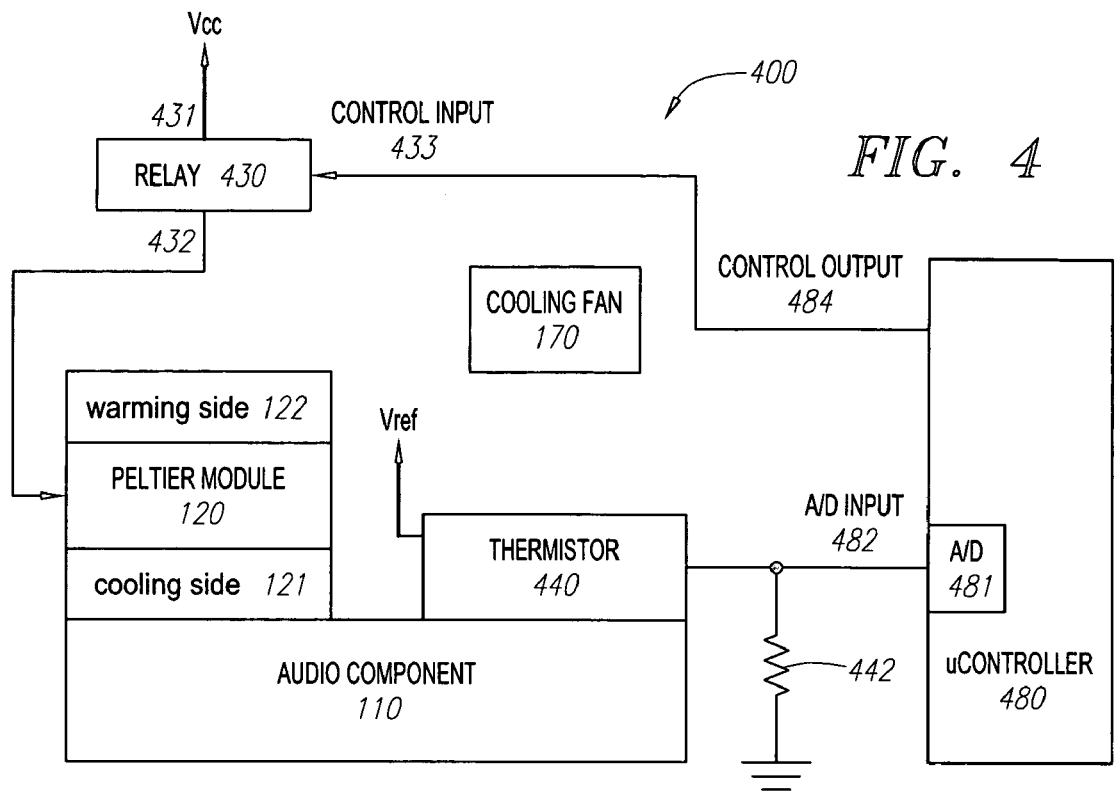
FIG. 4 is a simplified block diagram illustrating a microcontroller-based cooling system in accordance with the present invention.

FIG. 4 illustrates a cooling system 400 where a microcontroller 480 per-forms the functions of both the temperature reader and the feedback control circuit. Here, the microcontroller 480 includes an analog-to-digital (A/D) converter 481 and an input 482 to the A/D converter 481. The converter input 482 connects to the junction between a thermistor 440 and a resistor 442 to receive the voltage developed at the junction by the voltage divider formed by the resistor/thermistor combination. Note that the resistor 442 can be onboard the microcontroller 480, and that the relative positions of the thermistor 440 and the resistor 442 can be reversed.

The A/D converter 481 periodically digitizes the voltage at its input 482, and allows the CPU of the microcontroller 480 to read the digitized voltage. The microcontroller 480, executing program code stored in its memory, reads the digitized voltage, and calculates the temperature of the component 110 from the digitized voltage, the known resistance-versus-temperature characteristic curve of the thermistor 440, and the value of the reference voltage $V_{ref}$. Based on the temperature, and, possibly, other factors, the microcontroller 480 determines the amount of cooling to be delivered by the Peltier module 420 and, therefore, the length of the time period for activating the Peltier module 120. The microcontroller 480 then energizes a control input 433 of a relay 430 through the microcontroller's control output 484. The relay 430 closes its contacts 431 and 432, thereby activating the Peltier module 420.

Figure 5:
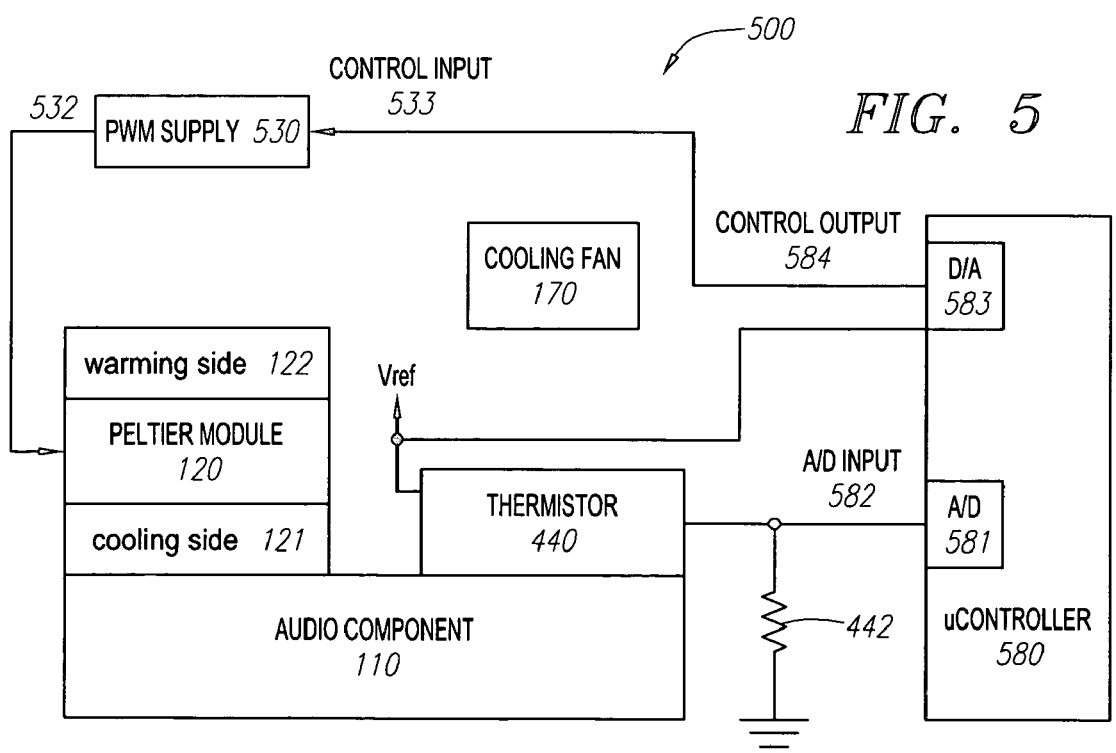
FIG. 5 is a simplified block diagram illustrating another microcontroller-based cooling system in accordance with the present invention.

FIG. 5 illustrates another microcontroller-based cooling system 500 in accordance with the present invention. Here, the microcontroller 580 includes an A/D converter 581 and a digital-to-analog (D/A) converter 583. As in the cooling system 400, the voltage divider made up of the thermistor 440 and the resistor 442 produces a voltage indicative of the temperature of the audio component 110. The microcontroller 580 periodically reads and digitizes the temperature indications through its A/D converter 581. The D/A converter 583 generates a voltage at a control output 583, under direction of the program code executed by the CPU of the microcontroller 580. The D/A converter 583 allows the microcontroller 580 to set the appropriate drive for the Peltier module 120 and output a corresponding voltage to a pulse-width modulated power supply 530. In this way, the D/A converter 583 can adjust the drive for the Peltier module 520 in small steps within the resolution of the D/A converter 583.

A controller of the cooling systems in accordance with the present invention, such as the microcontroller 480, microcontroller 580, or a digital processor with physically separate supporting circuitry, operates under control of program code. The code can be stored or embodied in an onboard (internal) memory of the controller, or on an external storage device, e.g., ROM or RAM module, magnetic disk/card, solid state memory card (Flash, memory stick), optical disk, or any other machine-readable storage medium. The program code directs the controller to perform the functions described above, such as reading the voltages indicative of the temperature and determining the drive current of the Peltier modules. The controller can of course perform additional functions, e.g., supervising the battery of the vehicle where the cooling system is installed, reading the output of a humidity sensor to determine whether the current through the Peltier module should be reversed to prevent condensation, and self-testing the cooling system.

Figure 6:
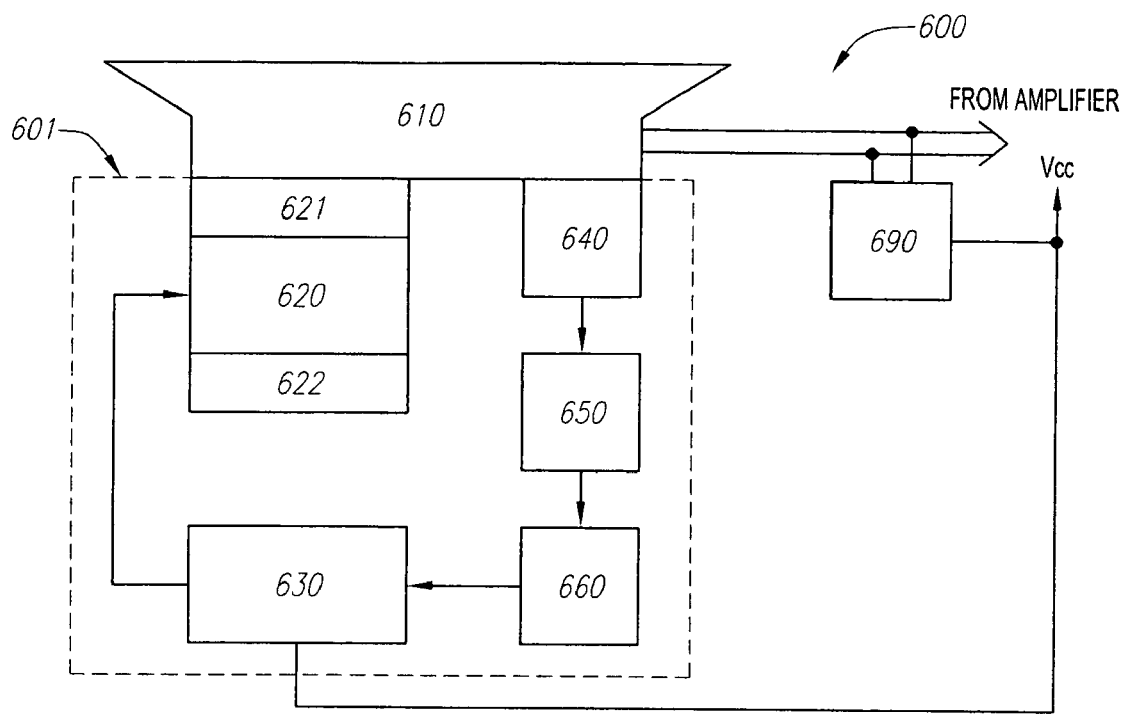
FIG. 6 is a simplified block diagram illustrating an audio signal-powered cooling system for a loudspeaker, in accordance with the present invention.

FIG. 6 illustrates a combination 600 of a loudspeaker 610, a cooling system 601, and an autonomous power supply 690 that powers the cooling system 601. Broadly, the cooling system includes a Peltier module 620 with cooling and warming sides 621 and 622, respectively, a temperature sensor 640, a temperature reader 650, a feedback control circuit 660, and a Peltier driver 630. These devices have been described above in relation to the similarly numbered and designated devices of FIGS. 1 through 5.

The power supply 690 connects to the input of the loudspeaker 610, which is driven by an audio amplifier (or another source of audio signal), and generates the power used by the cooling system 601 from the audio signal provided by the amplifier. This method of power generation obviates the need for a separate connection to a supply of electric energy, for example, the power supply of a vehicle where the loudspeaker 610 is installed, or a separate connection to an AC power outlet in a home installation.

Figure 7:
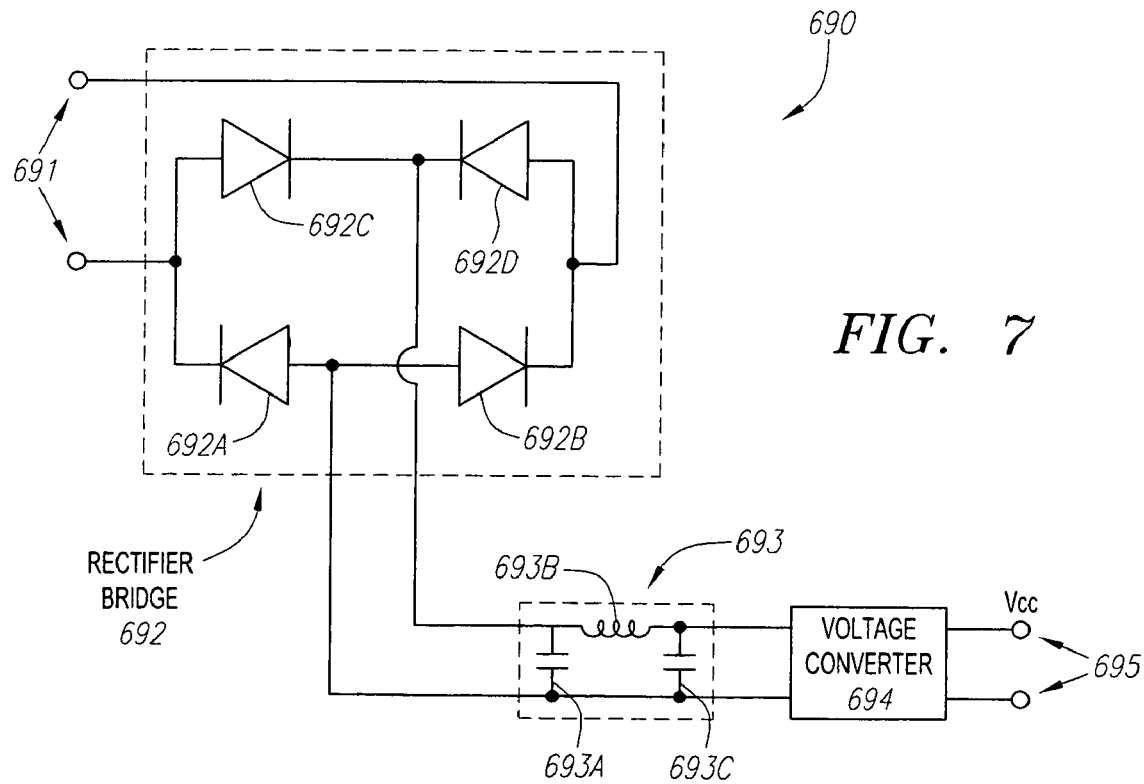
FIG. 7 is a simplified block diagram of a power supply that converts audio signals into electric power for use in a cooling system in accordance with the present invention.

FIG. 7 is a simplified schematic diagram of an exemplary embodiment of the autonomous power supply 690 of the combination 600. The power supply 690 includes terminals 691 for connecting the power supply 690 to the audio amplifier (not shown) in parallel with the loudspeaker 610 (also not shown). A rectifier bridge 692 employs four diodes, 692A through 692D, to perform full-wave rectification of the audio signal appearing at the terminals 691. In one alternative embodiment, a single diode device performs half-wave rectification of the audio signal. The rectified signal flows to a filter 693 that smoothes the waveform of the rectified signal before voltage conversion of the rectified signal to a supply voltage usable by the cooling system 601. In addition to smoothing the waveform of the rectified signal, the filter 693 also further isolates the noise generated by a voltage converter 694 and by the cooling system 691 from the audio signal at the terminals 691.

The voltage converter 694 converts the rectified and filtered audio signal into the supply voltage for the cooling system 601, and in particular into the supply voltage used by the Peltier driver 630 and the Peltier module 620. In one embodiment of the power supply 690, the voltage converter 694 is a regulator, used with or without a voltage drop resistor. In another embodiment, the voltage converter is a switching power supply. The switching power supply embodiment is generally more efficient than the embodiment with a regulator, but can generate undesirable noise feed through to the terminals 691 and the loudspeaker 610. The noise, however, can be eliminated if the switching speed of the regulator is above the audible frequency range, or above the high frequency corner cutoff of the loudspeaker 610. Thus in one embodiment of the combination 600, the voltage converter 690 is a switching power supply having a switching frequency above about 20 KHz.

The filter 693 is illustrated as a Π-topology device with two capacitors, 693A and 693C, and an inductor 693B. A person skilled in the art of filter design would be able to design an appropriate filter with any number of poles using other filter topologies and elements.

In the embodiment illustrated in FIG. 6, the Peltier module 620 and the temperature sensor 640 are attached directly to the loudspeaker 610. More specifically, the temperature sensor 640 and the cooling side 621 of the Peltier module 620 are in direct contact with the magnet of the loudspeaker 610.

As is evident from the above description, the power for the operation of the Peltier module 620 comes from the audio signal that also drives the loudspeaker 610. Consequently, the power level of the audio signal driving the loudspeaker 610 is diminished, reducing heat dissipation in the loudspeaker 610 and, therefore, further lowering the temperature of the loudspeaker 610. Nevertheless, the diversion of audio power from the loudspeaker 610 is an unwelcome side effect, because the total acoustic power available at the output of the loudspeaker 610 also decreases. To minimize the decrease in the acoustic power level, the trigger point for activation of the Peltier module 620 can be set close to the maximum rated temperature of the loudspeaker 610, or close to the point at which thermal protection of the loudspeaker 610 shuts the loudspeaker 610 down. (In this document, the lower of these two temperatures will be denoted as the "critical temperature" or $T_c$ hereinafter.) The trigger point can be set at the temperature below the critical temperature less the tolerance of the temperature sensor 640. In other words, the trigger point temperature ($T_t$) can be set according to the following formula: $T_t = (T_c - T_{tolerance} - T_m)$, where $T_{tolerance}$ is the tolerance of the temperature sensor 640, and $T_m$ is a design safety margin. In practice, the design safety margin $T_m$ can be set around 1° C.

Figure 8:
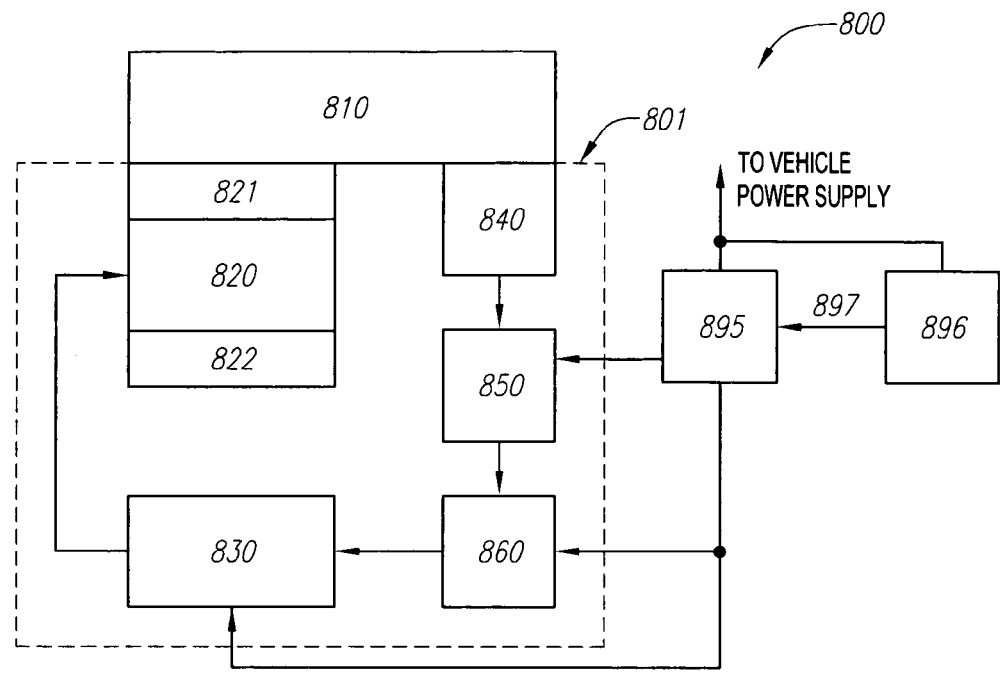
FIG. 8 is a simplified block diagram illustrating a cooling system with a power supply and a battery supervisor, in accordance with the present invention.

FIG. 8 illustrates a combination 800 of a car audio component cooling system 801 with a power supply 895 and a battery supervisor 896, in accordance with the present invention. Here, the cooling system 801 for an audio component 810 continues to receive power through its power supply 895 during periods when the audio component 810 is not operating. Moreover, the cooling system 801 is powered even when the car is left locked and unattended. During such periods, the cooling system 801 periodically checks the temperature of the audio component 810 and, if the temperature exceeds a predetermined inactive trigger temperature ($T_{inactive1}$), the cooling system 801 turns on its Peltier module 820 to bring the temperature of the audio component 810 below $T_{inactive2}$, where $T_{inactive1} \geq T_{inactive2}$. At the same time, a battery supervisor 896 monitors the state of the battery providing the power to the car where the audio component 810 and the cooling system 801 are installed. When the battery supervisor 896 detects that the battery has discharged below a predetermined level, the battery supervisor 896 issues a signal to the power supply 895 through a connection 897, turning off the power to the cooling system 801. This procedure prevents further discharge of the car's battery.

In one version of the combination 800, the battery supervisor 896 is a voltage comparator that shuts off the cooling system 801 when the battery voltage falls below a preset limit. In another version, the battery supervisor 896 calculates a moving average of the battery voltage over some averaging period, and compares the preset limit to the calculated moving average voltage. Testing the preset limit against the moving average of the battery voltage, instead of the instantaneous value of the voltage, prevents unneeded shutdowns of the cooling system 801 caused by short-term voltage drops occasioned by electromagnetic interference, by the car's security system, or by other internal or external factors.

In a third version of the combination 800, the battery supervisor 896 periodically performs an under-load test of the battery. To perform the test, the battery supervisor 896 measures the battery voltage with the Peltier module 820 in the off state, then activates the Peltier module 820 and measures the battery voltage again. The battery supervisor 896 computes an indication of the state of the battery from the absolute levels of the measured voltages and from the voltage drop under the load of the Peltier module 820. In this version of the combination 800, the battery supervisor determines that the battery has discharged below the predetermined level when the no-load battery voltage falls below a first limit ($V_h$), when the under-load battery voltage falls below a second limit ($V_l$), or when the voltage drop exceeds a voltage difference limit ($V_d$).

Figure 9:
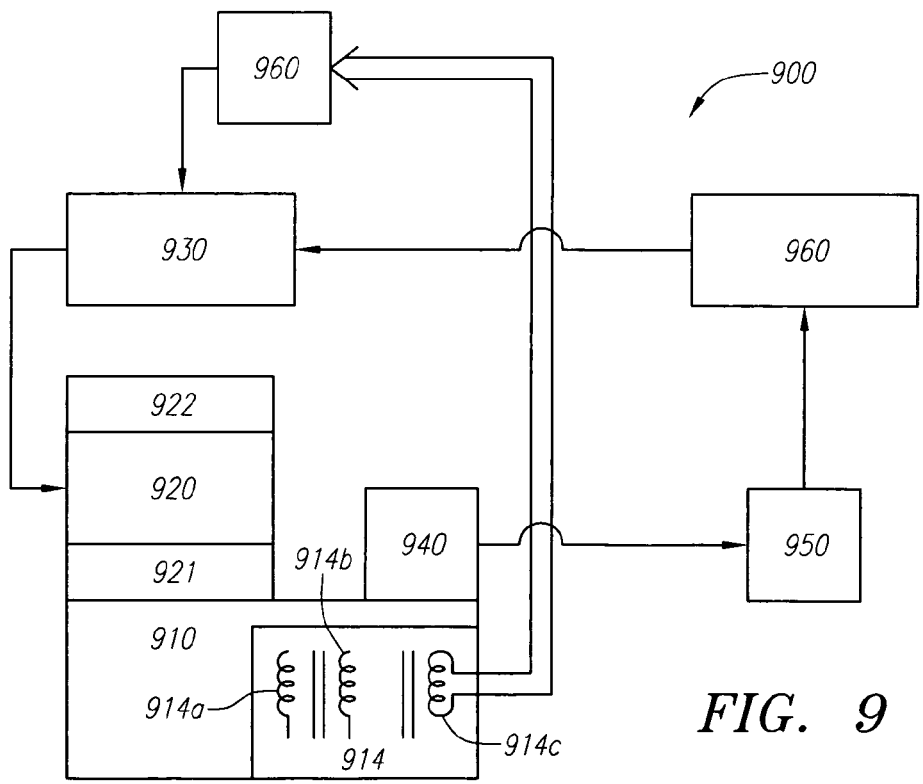
FIG. 9 is a simplified block diagram illustrating a cooling system powered by a step-up transformer of an amplifier cooled by the system.

FIG. 9 illustrates a cooling system 900 for an automotive audio amplifier 910 where the power for the operation of the Peltier module 920 comes from a high voltage rail power supply transformer 914 of the amplifier 910. Before continuing with the description of the cooling system 900, it is worthwhile to divert briefly and explain the function of the transformer 914 within the amplifier 910.

In 12-volt and other relatively low-voltage systems, high-power amplifiers often incorporate DC-to-DC power conversion systems for elevating the voltage that powers the amplifiers' output stages. Typically, the 12-volt DC voltage is converted into AC, which is then stepped-up by a transformer. The stepped-up voltage is rectified and otherwise conditioned to provide the power for the output stages. The transformer 114, which was referred to in relation to the cooling system 100 of FIG. 1, is one example of such a step-up transformer.

In the cooling system 900, the step-up transformer 914 includes primary windings 914a, secondary windings 914b, and auxiliary windings 914c. The secondary windings 914b generate a stepped-up voltage for the operation of the output stage of the amplifier 910 from the AC excitation applied to the primary windings 914a. Similarly, the auxiliary windings 914c generate a stepped-up auxiliary AC voltage for the operation of the Peltier module 920. Power supply 960 then rectifies and smoothes the auxiliary AC voltage and provides it to the Pulse-Width Modulator 930, which drives the Peltier module 920. In other respects, the cooling system 900 functions identically or similarly to the cooling systems 100, 400, 500, 600, and 800, and their various modifications and variants described above.

This document describes the inventive Peltier cooling systems and some of their features in considerable detail for illustration purposes only. Neither the specific embodiments of the invention as a whole, nor those of its features limit the general principles underlying the invention. In particular, the invention is not limited to thermistor-based temperature sensors, to specific Peltier modules described in this document, or to embodiments where the temperature sensor is in direct contact with the electronic component. Furthermore, many additional devices can be used to perform the functions of the temperature readers, feedback control circuits, Peltier drivers, and other components of the cooling system, of the cooling system's power supply circuit, and of the battery supervisor. Indeed, some elements can be omitted altogether. For example, a cooling fan can, but need not be included in some embodiments of the cooling system in accordance with the present invention. More generally, the specific features described herein may be used in some embodiments, but not in others, without departure from the spirit and scope of the invention as set forth. Many additional modifications are intended in the foregoing disclosure, and it will be appreciated by those of ordinary skill in the art that in some instances some features of the invention will be employed in the absence of a corresponding use of other features. The illustrative examples therefore do not define the metes and bounds of the invention and the legal protection afforded the invention, which function has been reserved for the claims and their equivalents.

The invention claimed is:

1. A temperature control system for an electronic component, the system comprising:
    a Peltier module comprising a cooling side that absorbs heat when electric current flows through the Peltier module in a first direction;
    a Peltier driver comprising a control input capable of receiving control signals, the Peltier driver being capable of providing to the Peltier module a current regulated by the control signals;
    a temperature sensor that generates indications of temperature of the electronic component;
    a temperature reader coupled to the temperature sensor to receive the indications of temperature from the temperature sensor, the temperature reader being capable of interpreting the indications of temperature and generating temperature signals from the temperature indications;
    a feedback control circuit coupled to the temperature reader to receive the temperature signals from the temperature reader, the feedback control circuit comprising a control output coupled to the control input of the Peltier driver to provide the control signals regulating the current to the Peltier module; and
    a fan capable of blowing air to reduce temperature of the electronic component;
    where in the fan blows the air towards the cooling side of the Peltier module and at the electronic component, and the air passes near the cooling side of the Peltier module before the air reaches the electronic component, so that the cooling side of the Peltier module absorbs heat from the air before the air reaches the electronic component.

2. A temperature control system for an electronic component, the system comprising:
    a Pettier module comprising a cooling side that absorbs heat when electric current flows through the Peltier module in a first direction;
    a Peltier driver comprising a control input capable of receiving control signals, the Peltier driver being capable of providing to the Peltier module a current regulated by the control signals;
    a temperature sensor that generates indications of temperature of the electronic component;
    a temperature reader coupled to the temperature sensor to receive the indications of temperature from the temperature sensor, the temperature reader being capable of interpreting the indications of temperature and generating temperature signals from the temperature indications;
    a feedback control circuit coupled to the temperature reader to receive the temperature signals from the temperature reader, the feedback control circuit comprising a control output coupled to the control input of the Peltier driver to provide the control signals regulating the current to the Peltier module;
    a fan capable of blowing air to reduce temperature of the electronic component; and
    a heat sink attached to the electronic component, wherein the fan blows the air towards the cooling side of the Peltier module and at the heat sink, and the air passes near the cooling side of the Peltier module before the air reaches the heat sink, so that the cooling side of the Peltier module absorbs heat from the air before the air reaches the heat sink.

3. A temperature control system for an electronic component, the system comprising:
    a Peltier module comprising a cooling side that absorbs heat when electric current flows through the Peltier module in a first direction;
    a Peltier driver comprising a control input capable of receiving control signals, the Peltier driver being capable of providing to the Peltier module a current regulated by the control signals;
    a temperature sensor that generates indications of temperature of the electronic component;
    a temperature reader coupled to the temperature sensor to receive the indications of temperature from the temperature sensor, the temperature reader being capable of interpreting the indications of temperature and generating temperature signals from the temperature indications;
    a feedback control circuit coupled to the temperature reader to receive the temperature signals from the temperature reader, the feedback control circuit comprising a control output coupled to the control input of the Peltier driver to provide the control signals regulating the current to the Peltier module;
    a relative humidity sensor that provides relative humidity measurements to the feedback control circuit;
    wherein:
    the feedback control circuit provides a first control signal of the signals regulating the current to the Peltier module in response to receiving a first temperature signal of the temperature signals, the first temperature signal signifying a temperature above a preset high temperature limit;
    the first control signal directs the Peltier driver to provide a first current to the Peltier module, the first current flowing in the first direction and causing the cooling side to absorb heat from the electronic component;
    the cooling side of the Peltier module releases heat when the current flows through the Peltier module in a second direction;
    the feedback control circuit provides a second control signal of the signals regulating the current to the Peltier module in response to receiving a relative humidity measurement over a preset high humidity limit; and
    the second control signal directs the Peltier driver to provide a second current to the Peltier module, the second current flowing in the second direction and causing the cooling side to release heat.

4. A temperature control system for an electronic component, the system comprising:
    a Peltier module comprising a cooling side that absorbs heat when electric current flows through the Peltier module in a first direction;
    a Peltier driver comprising a control input capable of receiving control signals, the Peltier driver being capable of providing to the Peltier module a current regulated by the control signals;
    a temperature sensor that generates indications of temperature of the electronic component;
    a temperature reader coupled to the temperature sensor to receive the indications of temperature from the temperature sensor, the temperature reader being capable of interpreting the indications of temperature and generating temperature signals from the temperature indications; and a feedback control circuit coupled to the temperature reader to receive the temperature signals from the temperature reader, the feedback control circuit comprising a control output coupled to the control input of the Peltier driver to provide the control signals regulating the current to the Peltier module;

wherein the Peltier module further comprises two pairs of cascaded thermocouples.

5. A temperature control system for an electronic component, the system comprising:

a Peltier module comprising a cooling side that absorbs heat when electric current flows through the Peltier module in a first direction;

a Peltier driver comprising a control input capable of receiving control signals, the Peltier driver being capable of providing to the Peltier module a current regulated by the control signals;

a temperature sensor that generates indications of temperature of the electronic component;

a temperature reader coupled to the temperature sensor to receive the indications of temperature from the temperature sensor, the temperature reader being capable of interpreting the indications of temperature and generating temperature signals from the temperature indications;

a feedback control circuit coupled to the temperature reader to receive the temperature signals from the temperature reader, the feedback control circuit comprising a control output coupled to the control input of the Peltier driver to provide the control signals regulating the current to the Peltier module;

wherein:

the temperature sensor comprises a thermistor with resistance varying over temperature;

the temperature reader comprises a voltage comparison device, the voltage comparison device comprises a pair of inputs and an output, the output of the voltage comparison device assuming a first state when a first voltage at a first input of the pair of inputs is higher than a second voltage at a second input of the pair of inputs, the output of the voltage comparison device assuming a second state when the first voltage is lower than the second voltage; and the first voltage or the second voltage varies with the resistance of the thermistor.

6. A temperature control system in accordance with claim 5, wherein:

the Peltier driver comprises a drive source; and the feedback control system comprises a switch that couples the drive source to the Peltier module and uncouples the drive source from the Peltier module depending on the state of the output of the voltage comparison device.

7. A temperature control system in accordance with claim 6, wherein the drive source is a voltage source.

8. A temperature control system in accordance with claim 6, wherein the drive source is a current source.

9. A temperature control system for an electronic component, the system comprising:

a Peltier module comprising a cooling side that absorbs heat when electric current flows through the Peltier module in a first direction;

a Peltier driver comprising a control input capable of receiving control signals, the Peltier driver being capable of providing to the Peltier module a current regulated by the control signals;

a temperature sensor that generates indications of temperature of the electronic component;

a temperature reader coupled to the temperature sensor to receive the indications of temperature from the temperature sensor, the temperature reader being capable of interpreting the indications of temperature and generating temperature signals from the temperature indications; and a feedback control circuit coupled to the temperature reader to receive the temperature signals from the temperature reader, the feedback control circuit comprising a control output coupled to the control input of the Peltier driver to provide the control signals regulating the current to the Peltier module;

wherein:

the temperature sensor comprises a thermistor with resistance varying over temperature; and the temperature reader comprises:

a voltage comparison device, the voltage comparison device comprises a plus input, a minus input, and an output, the output of the voltage comparison device assuming an ON state when a first voltage at the plus input is higher than a second voltage at the minus input, the output of the voltage comparison device assuming an OFF state when the second voltage is higher than the first voltage;

a resistor coupled between the output and the plus input of the voltage comparison device to add hysteresis to the response of the temperature reader; and a voltage at an input of the voltage comparison device varies with the resistance of the thermistor.

10. A temperature control system in accordance with claim 9, wherein:

the feedback control circuit comprises an integrator that integrates the state of the output of the voltage comparison device to produce an integrated feedback control signal; and the Peltier driver comprises a pulse-width modulated power supply coupled to the feedback control circuit to receive the integrated feedback control signal and to drive the Peltier module with power pulses of duty cycle modulated by the integrated feedback control signal.

11. A temperature control system for an electronic component installed in a vehicle, the vehicle comprising a battery, the temperature control system comprising:

a Peltier module comprising a cooling side that absorbs heat when electric current flows through the Peltier module in a first direction;

a Peltier driver comprising a drive source and a control input capable of receiving control signals, the Peltier driver being capable of providing to the Peltier module a current regulated by the control signals;

a temperature sensor that generates indications of temperature of the electronic component;

a temperature reader coupled to the temperature sensor to receive the indications of temperature from the temperature sensor, the temperature reader being capable of interpreting the indications of temperature and generating temperature signals from the temperature indications;

a feedback control circuit coupled to the temperature reader to receive the temperature signals from the temperature reader, the feedback control circuit comprising a control output coupled to the control input of the Peltier driver to provide the control signals regulating the current to the Peltier module, wherein the feedback control circuit provides a first control signal of the signals regulating the current to the Peltier module in response to receiving a first temperature signal of the temperature signals, the first temperature signal signifying a temperature above a preset high temperature limit, and the first control signal directs the Peltier driver to provide a first current to the Peltier module, the first current flowing in the first direction and causing the cooling side to absorb heat from the electronic component;

a power supply circuit providing power to the drive source; and a battery monitor supervising the battery of the vehicle and turning off the power supply when the battery discharges to a predetermined state.

12. A temperature control system for a loudspeaker installed in a vehicle and receiving an audio signal, the vehicle comprising a battery, the temperature control system comprising:

a Peltier module comprising a cooling side that absorbs heat when electric current flows through the Peltier module in a first direction;

a Peltier driver comprising a drive source and a control input capable of receiving control signals, the Peltier driver being capable of providing to the Peltier module a current regulated by the control signals;

a temperature sensor that generates indications of temperature of the loudspeaker;

a temperature reader coupled to the temperature sensor to receive the indications of temperature from the temperature sensor, the temperature reader being capable of interpreting the indications of temperature and generating temperature signals from the temperature indications;

a feedback control circuit coupled to the temperature reader to receive the temperature signals from the temperature reader, the feedback control circuit comprising a control output coupled to the control input of the Peltier driver to provide the control signals regulating the current to the Peltier module, wherein the feedback control circuit provides a first control signal of the signals regulating the current to the Peltier module in response to receiving a first temperature signal of the temperature signals, the first temperature signal signifying a temperature above a preset high temperature limit, the first control signal directs the Peltier driver to provide a first current to the Peltier module, the first current flowing in the first direction and causing the cooling side to absorb heat from the electronic component; and a power supply circuit generating power for the drive source from the audio signal.

13. A temperature control system for an audio component, the temperature control system comprising:

a first thermocouple junction that absorbs heat when electric current flows through the first thermocouple junction in a first direction;

a driver circuit coupled to the first thermocouple junction to provide a temperature controlled current through the junction, the driver circuit comprising a control input capable of receiving a control signal that regulates the temperature controlled current;

a temperature sensor that generates indications of temperature of the audio component; and a controller comprising:

an input unit coupled to the temperature sensor, the input unit being capable of reading the indications of temperature of the audio component;

a control output coupled to the control input of the driver circuit to send the control signal to the control input of the driver circuit; and a processor coupled to the input unit and to the control output, the processor being capable of interpreting the indications of temperature of the audio component and varying the control signal so that the first thermocouple junction absorbs heat when the temperature sensor indicates that temperature of the audio component exceeds a first parameter, and so that the first thermocouple does not absorb heat when the temperature sensor indicates that the audio component does not exceed a second parameter.

14. A temperature control system according to claim 13, wherein the processor comprises a digital central processing unit.

15. A temperature control system according to claim 14, wherein the input unit comprises an analog-to-digital converter that digitizes the indications of temperature to provide digitized temperature readings to the digital central processing unit.

16. A temperature control system according to claim 14, wherein the temperature sensor comprises a digital connection, the temperature sensor being coupled to the controller and being readable by the processor through the digital connection, the temperature sensor being capable of providing the indications of temperature to the processor through the digital connection.

17. A temperature control system according to claim 15, wherein the audio component is installed in a vehicle, the vehicle comprises a source of electric energy, the temperature control system being coupled to the source of electric energy to receive energy for the operation of the system from the source of electric energy.

18. A temperature control system according to claim 17, wherein the temperature sensor comprises a thermistor.

19. A temperature control system in accordance with claim 17, further comprising a fan for blowing air at the audio component.

20. A temperature control system in accordance with claim 17, further comprising:

a heat sink attached to the audio component; and a fan for blowing air at the heat sink;

wherein the first thermocouple is attached to the heat sink.

21. A temperature control system in accordance with claim 17, further comprising a fan blowing air towards the first thermocouple and the at audio component, wherein the air passes near the first thermocouple before the air reaches the audio component, so that the first thermocouple absorbs heat from the air before the air reaches the audio component.

22. A temperature control system in accordance with claim 17, further comprising:

a second thermocouple junction in series with the first thermocouple junction, the second thermocouple junction releasing heat when electric current flows trough the second thermocouple in the first direction; and a fan blowing air at the second thermocouple junction so as to remove heat from the second thermocouple.

23. A temperature control system in accordance with claim 17, wherein:

the driver circuit comprises a drive source; and the audio component comprises a loudspeaker installed in a vehicle, the vehicle comprising a battery, the loudspeaker receiving an audio signal;

the system further comprises:
a power supply circuit generating power for the drive source from the audio signal.

24. A temperature control system in accordance with claim 17, wherein:
the driver circuit comprises a drive source; and
the audio component is installed in a vehicle, the vehicle comprising a battery;
the system further comprises:
a power supply circuit providing power to the drive source; and
a battery monitor supervising the battery of the vehicle and turning off the power supply circuit when the battery discharges to a predetermined state.

25. A temperature control system in accordance with claim 17, wherein the first parameter is identical to the second parameter.

26. A temperature control system according to claim 18, wherein the driver circuit comprises a drive source.

27. A temperature control system according to claim 14, wherein the driver circuit further comprises a switch controlled by the control signal, the switch coupling the drive source to the first thermocouple junction and uncoupling the drive source from the first thermocouple junction depending on the state of the control signal.

28. A temperature control system for an audio component, the temperature control system comprising:
a first thermocouple junction that absorbs heat when electric current flows through the first thermocouple junction in a first direction;
a variable driver circuit coupled to the first thermocouple junction to provide a temperature controlled current through the first junction, the variable driver circuit comprising a control input capable of receiving a control signal that regulates the temperature controlled current;
a temperature sensor that generates indications of temperature of the audio component; and
a controller comprising:
an input unit coupled to the temperature sensor, the input unit being capable of reading the indications of temperature of the audio component;
a digital-to-analog converter comprising a control output coupled to the control input of the variable driver circuit, the digital-to-analog converter being capable of generating the control signal; and
a digital processor coupled to the input unit and to the digital-to-analog converter, the digital processor being capable of interpreting the indications of temperature of the audio component and instructing the digital-to-analog converter to vary the control signal so that the first thermocouple junction absorbs heat when the temperature sensor indicates that temperature of the audio component exceeds a first parameter, and so that the first thermocouple does not absorb heat when the temperature sensor indicates that temperature of the audio component does not exceed a second parameter.

29. A temperature control system according to claim 28, wherein the input unit comprises an analog-to-digital converter that digitizes the indications of temperature to provide digitized temperature readings to the digital central processing unit.

30. A temperature control system according to claim 29, wherein the audio component is installed in a vehicle, the vehicle comprising a source of electric energy, the temperature control system being coupled to the source of electric energy to receive energy for the operation of the system from the source of electric energy.

31. A temperature control system according to claim 30, wherein the temperature sensor comprises a thermistor.

32. A temperature control system according to claim 30, wherein the temperature sensor comprises a digital connection, the temperature sensor being coupled to the controller and readable by the processor through the digital connection, the temperature sensor providing the indications of temperature to the processor through the digital connection.

33. A temperature control system in accordance with claim 30, further comprising a fan capable of blowing air at the audio component.

34. A temperature control system in accordance with claim 30, further comprising:
a heat sink attached to the audio component; and
a fan capable of blowing air at the heat sink;
wherein the first thermocouple is attached to the heat sink.

35. A temperature control system in accordance with claim 30, further comprising a fan capable of blowing air towards the first thermocouple and at the audio component, wherein the air passes near the first thermocouple before the air reaches the audio component, so that the first thermocouple absorbs heat from the air before the air reaches the audio component.

36. A temperature control system in accordance with claim 30, further comprising:
a second thermocouple junction in series with the first thermocouple junction, the second thermocouple junction releasing heat when electric current flows in the first direction; and
a fan capable of blowing air at the second thermocouple junction so as to remove heat from the second thermocouple.

37. A temperature control system in accordance with claim 30, wherein the first parameter is identical to the second parameter.

38. A temperature control system according to claim 31, wherein the variable driver circuit comprises a drive source.

39. A temperature control system according to claim 38, wherein the variable driver circuit comprises a pulse-width modulated power supply generating pulses of the temperature controlled current through the first thermocouple, the pulses of the temperature controlled current being of variable duty cycle, the duty cycle varying with the control signal.

40. A cooling system for an audio component of a vehicle, the cooling system comprising:
a Peltier module comprising a cooling side that absorbs heat when electric current flows through the Peltier module in a first direction;
a Peltier driver comprising a control input capable of receiving a control signal, the Peltier driver being coupled to the Peltier module to provide to the Peltier module a current regulated by the control signal;
a temperature sensor that generates indications of temperature of the audio component;
a feedback mechanism that receives the temperature indications from the temperature sensor and adjusts the control signal to vary the current to the Peltier module to prevent the temperature of the audio component from exceeding a predetermined parameter;
a power supply that provides power to the Peltier driver; and
a battery supervisor that provides a discharge signal to the power supply when a battery of the vehicle discharges to a first predetermined state, the discharge signal causing the power supply to stop providing power to the Peltier driver.

41. A method for controlling temperature of an audio component installed in a vehicle, the method comprising the following steps:
   providing a thermocouple junction that absorbs heat dissipated in the audio component when electric current flows through the thermocouple junction in a first direction;
   providing an adjustable current to the thermocouple junction;
   measuring the temperature of the audio component to obtain temperature measurements;
   adjusting the current to the thermocouple junction in response to the temperature measurements so as to cause the thermocouple junction to absorb the heat dissipated in the audio component when the temperature of the audio component exceeds a predetermined parameter.

42. A method in accordance with claim 41, wherein the audio component is a loudspeaker receiving an audio signal, the method further comprising a step of generating the adjustable current from the audio signal.

43. A method in accordance with claim 41, wherein the audio component is a loudspeaker receiving an audio signal, the method further comprising a step for generating the adjustable current from the audio signal.

44. A method in accordance with claim 41, further comprising the steps of:
   monitoring a power source of the vehicle;
   turning off the current to the thermocouple when the power source discharges to a predetermined state.

45. A cooling system for an audio amplifier of a vehicle, the amplifier comprising a step-up high voltage rail transformer, the cooling system comprising:
   a Peltier module comprising a cooling side that absorbs heat when electric current flows through the Peltier module in a first direction;
   a Peltier driver comprising a control input capable of receiving a control signal, the Peltier driver being coupled to the Peltier module to provide to the Peltier module a current regulated by the control signal;
   a temperature sensor that generates indications of temperature of the audio component;
   a feedback mechanism that receives the temperature indications from the temperature sensor and adjusts the control signal to vary the current to the Peltier module to prevent the temperature of the audio component from exceeding a predetermined parameter;
   auxiliary windings on the transformer that generate an auxiliary stepped-up AC voltage; and
   a power supply that receives the auxiliary stepped-up AC voltage and generates current provided to the Peltier module.

46. A cooling system for an audio amplifier, the amplifier comprising a step-up high voltage rail transformer, the cooling system comprising:
   a Peltier module comprising a cooling side that absorbs heat when electric current flows through the Peltier module in a first direction, the cooling side being in contact with the transformer;
   a Peltier driver comprising a control input capable of receiving a control signal, the Peltier driver being coupled to the Peltier module to provide to the Peltier module a current regulated by the control signal;
   a temperature sensor that generates indications of temperature of the audio component; and
   a feedback mechanism that receives the temperature indications from the temperature sensor and adjusts the control signal to vary the current to the Peltier module to prevent the temperature of the audio component from exceeding a predetermined parameter.

47. A cooling system in accordance with claim 46, further comprising a heat sink, wherein:
   the Peltier module further comprises a warming side that releases heat when electric current flows through the Peltier module in the first direction; and
   the warming side is in contact with the heat sink.

48. A cooling system for an audio amplifier, the amplifier comprising an output stage device, the cooling system comprising:
   a Peltier module comprising a cooling side that absorbs heat when electric current flows through the Peltier module in a first direction, the cooling side being in contact with the output stage device;
   a Peltier driver comprising a control input capable of receiving a control signal, the Peltier driver being coupled to the Peltier module to provide to the Peltier module a current regulated by the control signal;
   a temperature sensor that generates indications of temperature of the audio component; and
   a feedback mechanism that receives the temperature indications from the temperature sensor and adjusts the control signal to vary the current to the Peltier module to prevent the temperature of the audio component from exceeding a predetermined parameter.

49. A cooling system in accordance with claim 48, further comprising a heat sink, wherein:
   the Peltier module further comprises a warming side that releases heat when electric current flows through the Peltier module in the first direction; and
   the warming side is in contact with the heat sink.

* * * * *